(12) United States Patent
Assefa et al.

(10) Patent No.: US 7,531,367 B2
(45) Date of Patent: May 12, 2009

(54) UTILIZING SIDEWALL SPACER FEATURES TO FORM MAGNETIC TUNNEL JUNCTIONS IN AN INTEGRATED CIRCUIT

(75) Inventors: Solomon Assefa, Elmsford, NY (US); Michael C. Gaidis, Wappingers Falls, NY (US); Sivananda Kanakasabapathy, Hopewell Junction, NY (US); John P. Hummel, Millbrook, NY (US); David W. Abraham, Croton-on-Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 449 days.

(21) Appl. No.: 11/333,997

(22) Filed: Jan. 18, 2006

(65) Prior Publication Data
US 2007/0166840 A1    Jul. 19, 2007

(51) Int. Cl.
*H01L 21/00* (2006.01)
(52) U.S. Cl. .................. 438/3; 257/E21.665
(58) Field of Classification Search ...... 438/3; 257/E21.035, E21.665, 295, 506, 508; 216/22
See application file for complete search history.

(56) References Cited

U.S. PATENT DOCUMENTS

| | | | |
|---|---|---|---|
| 4,648,937 A | 3/1987 | Ogura et al. | |
| 5,068,202 A | 11/1991 | Crotti et al. | |
| 5,227,014 A | 7/1993 | Crotti et al. | |
| 6,770,209 B2 | 8/2004 | Snyder et al. | |
| 6,897,532 B1* | 5/2005 | Schwarz et al. | 257/367 |
| 6,972,265 B1* | 12/2005 | Schwarz | 438/720 |
| 7,335,960 B2* | 2/2008 | Han et al. | 257/421 |
| 2004/0041182 A1* | 3/2004 | Tuttle et al. | 257/295 |
| 2005/0079638 A1* | 4/2005 | Drewes et al. | 438/3 |

OTHER PUBLICATIONS

R. Desikan et al., "On-chip MRAM as a High-Bandwidth Low Latency Replacement for DRAM Physical Memories," Tech Report TR-02-47, Dept. of Computer Sciences, University of Texas, Sep. 2002, 18 pages.

* cited by examiner

*Primary Examiner*—M. Wilczewski
*Assistant Examiner*—Seth Barnes
(74) *Attorney, Agent, or Firm*—Ido Tuchman; Ryan, Mason & Lewis, LLP

(57) ABSTRACT

Novel methods for reliably and reproducibly forming magnetic tunnel junctions in integrated circuits are described. In accordance with aspects of the invention, sidewall spacer features are utilized during the processing of the film stack. Advantageously, these sidewall spacer features create a tapered masking feature which helps to avoid byproduct redeposition during the etching of the MTJ film stack, thereby improving process yield. Moreover, the sidewall spacer features may be used as encapsulating layers during subsequent processing steps and as vertical contacts to higher levels of metallization.

1 Claim, 2 Drawing Sheets

UTILIZING SIDEWALL SPACER FEATURES TO FORM MAGNETIC TUNNEL JUNCTIONS IN AN INTEGRATED CIRCUIT

FIELD OF THE INVENTION

This invention relates generally to integrated circuits, and more particularly to techniques for utilizing sidewall spacer features to form magnetic tunnel junctions in integrated circuits.

BACKGROUND OF THE INVENTION

Magnetic memory devices, such as magnetic random access memory (MRAM) devices, use magnetic memory cells to store information. Information is stored in a magnetic memory cell as the orientation of the magnetization of a free layer in the magnetic memory cell as compared to the orientation of the magnetization of a fixed or pinned layer in the memory cell. The magnetization of the free layer may be oriented parallel or anti-parallel to the fixed layer, representing either a logic "0" or a logic "1." One type of memory cell, a magnetic tunnel junction (MTJ), comprises a free layer and a fixed layer separated by a thin dielectric barrier (a tunnel barrier), which typically comprises aluminum oxide. The resistance of the memory cell depends on the direction of magnetization of the free layer relative to the direction of magnetization of the fixed layer. Thus, the state of the cell can be sensed by measuring its resistance.

Reactive ion etching (RIE) is commonly used in MRAM processing as a means of patterning MTJ features. In RIE, reactive gases are ionized and accelerated towards the substrate. These reactive gases play two roles. They sputter the material from the surface, as well as chemically react with the material, thereby producing reaction products that are volatile and can be pumped away.

Because the etching medium is a flux of ions directed towards the substrate, RIE is predominantly anisotropic, meaning that etching occurs preferentially in the direction normal to the substrate. This translates into an etch rate on surfaces perpendicular to the substrate that is much lower than the etch rate on surfaces parallel to the substrate. As a result, redeposition of etching byproducts may occur, particularly on the sidewalls of vertical features where the etch rate is relatively low.

Such byproduct redeposition is especially problematic in producing MRAM circuitry. The etching byproducts formed when etching MTJ features are extremely difficult or impractical to remove without using methods that also cause harm to the sensitive film stack that makes up the etched device itself. As a result, redeposition of etching byproducts remains a major source of yield reduction in MRAM processing.

It is known that tapering an etched feature can result in increased sputter yield at the feature's sidewalls, and, thereby, reduce redeposition. The difficulty, however, lies in finding a reliable and reproducible way of forming such a taper. Two techniques are known in the art. In a first technique, the RIE chemistry is adjusted by balancing the rates of anisotropic physical sputtering, isotropic chemical etching, and byproduct redeposition. However this balancing process is complex, and the balance of these three components is highly sensitive to the condition of the etch tool.

In a second technique, a masking layer is first deposited on the film stack and patterned such that the masking layer can act as a hard mask during the etching of the underlying film stack. The masking layer is then physically sputtered so that its corners are eroded, thereby creating a taper in the masking layer which can subsequently be translated into the film stack. Nevertheless, because of the possibility of damage to the underlying film stack, the physical sputtering of the masking layer is usually limited. This frequently means that lower reaches of the masking layer cannot be tapered sufficiently. As a result, the redeposition of etching byproducts is frequently still problematic when subsequently etching the remainder of the film stack.

Accordingly, there is a need for a method of forming MTJ features in MRAM integrated circuits that is both more reliable and more reproducible than those currently known in the art, and does not suffer from one or more problems exhibited by conventional MTJ processing methodologies.

SUMMARY OF THE INVENTION

The present invention addresses the above-identified needs by providing a novel method for reliably and reproducibly forming MTJs. An embodiment of the invention achieves this, at least in part, by the use of sidewall spacer features during the processing of the film stack. Advantageously, these sidewall spacer features create both a characteristic tapered masking feature as well as an encapsulating layer for protecting a portion of the film stack during subsequent processing steps. Moreover, as an added benefit, the sidewall spacer features may, under certain circumstances, be left in place and used as vertical contacts to higher levels of metallization.

In accordance with an aspect of the invention, a method of forming MTJ features in integrated circuits comprises forming a film stack wherein the film stack comprises one or magnetic materials. After forming the film stack, one or more trenches are formed in the film stack such that the sidewalls of the trenches are substantially vertical. Next, a spacer layer is deposited on the film stack. The spacer layer is subsequently etched so that the spacer layer only remains on the sidewalls of the trenches in the film stack. The film stack is subsequently further etched utilizing the etched spacer layer as a mask.

In an illustrative embodiment, a film stack includes a lower magnetic layer, dielectric layer, upper magnetic layer and a masking layer. In processing this film stack, trenches with substantially vertical sidewalls are first formed in the masking layer. Next, sidewall spacer features are formed on the sidewalls of these trenches utilizing easily controlled deposition and etching techniques. These sidewall spacer features have characteristic tapered profiles. Subsequently, with the patterned masking layer and sidewall spacer features acting as masks, the remainder of the film stack is etched leading to a tapered film stack profile. Redeposition of etching byproducts is thereby reduced, resulting in improved MRAM processing yield.

These and other features and advantages of the present invention will become apparent from the following detailed description which is to be read in conjunction with the accompanying figures.

DETAILED DESCRIPTION OF THE INVENTION

This invention will be illustrated herein in conjunction with exemplary methods for forming MTJ features in integrated circuitry. It should be understood, however, that the invention is not limited to the particular materials, film layers and processing steps shown and described herein. Modifications to the illustrative embodiments will become apparent to those skilled in the art.

Particularly with respect to processing steps, it is emphasized that the descriptions provided herein are not intended to encompass all of the processing steps which may be required to successfully form a functional device. Rather, certain processing steps which are conventionally used in forming integrated circuit devices, such as, for example, wet cleaning and annealing steps, are purposefully not described herein for economy of description. However one skilled in the art will readily recognize those processing steps omitted from this generalized description. Moreover, details of the process steps used to fabricate such semiconductor devices may be found in a number of publications, for example, S. Wolf and R. N. Tauber, *Silicon Processing for the VLSI Era, Volume* 1, Lattice Press, 1986 and S. M. Sze, *VLSI Technology, Second Edition*, McGraw-Hill, 1988, both of which are incorporated herein by reference.

It should also be understood that the various layers and/or regions shown in the accompanying figures are not drawn to scale, and that one or more semiconductor layers and/or regions of a type commonly used in such integrated circuits may not be explicitly shown in a given figure for ease of explanation. This does not imply that the semiconductor layers and/or regions not explicitly shown are omitted from the actual integrated circuit.

Figure 1A:
FIGS. 1A-1G show sectional views of MTJ features during various states of processing in accordance with a first illustrative embodiment of the invention.

FIGS. 1A-1G show sectional views of MTJ features during various states of processing in accordance with a first illustrative embodiment of the invention. FIG. 1A shows a film stack after deposition of the layers that will eventually form the data storage portion of the MTJ features. For illustrative purposes, the film stack is shown to consist of a lower magnetic layer 110 and an upper magnetic layer 120. A thin dielectric layer 130 lies in between the magnetic layers 110, 120, and acts as a tunneling barrier in the MTJ device.

Each magnetic layer 110, 120 may further comprise a number of sublayers. These sublayers may be formed from many different materials and may serve various functions such as, but not limited to, acting as barrier layers, seed layers, antiferromagnetic layers, coupling layers and ferromagnetic layers. Desikan et al., for example, describes a MTJ with a lower magnetic layer comprising five sublayers formed of cobalt/iron, nickel/iron, manganese/iron, platinum and tungsten, respectively. Desikan et al., *On-chip MRAM as a High-Bandwidth Low Latency Replacement for DRAM Physical Memories*, Tech Report TR-02-47, Dept. of Computer Sciences, University of Texas, September 2002. The upper magnetic layer in the same device comprises three sublayers formed of nickel/iron, cobalt/iron and platinum, respectively. Id. The dielectric barrier is aluminum oxide. Id. For illustrative purposes herein, only the upper magnetic layer 120 is shown to further comprise three sublayers, more particularly, a lower magnetic sublayer 122, a coupling sublayer 124, and an upper magnetic sublayer 126. Lower magnetic layer 110 is shown as a solid object in the figures for simplicity of illustration even though it too will typically comprise a plurality of sublayers.

One skilled in the art will recognize the functions of the magnetic layers 110, 120 and the dielectric layer 130 in a MTJ. Briefly, one of the magnetic layers, which may be referred to as a fixed magnetic layer, has a magnetic polarization that is pinned in a fixed direction while the polarization of the other magnetic layer, which may be referred to as a free magnetic layer, has a magnetic polarization that is aligned either parallel or antiparallel to the fixed magnetic layer. The resistance of a memory cell employing the MTJ storage element will be either low or high depending on the relative polarization (parallel or antiparallel) of the free magnetic layer relative to the fixed magnetic layer. To provide a write capability, an applied magnetic field can switch the polarization of the free magnetic layer with respect to the fixed magnetic layer. In a typical MRAM array, orthogonal lines (i.e., bitlines and wordlines) pass under and over the MTJ, carrying current that produces the switching field. The MTJ is designed so that its logic state will not be changed when current is applied to just one line, but will always be written when current is flowing through both lines that cross at the selected device.

Techniques for depositing metal layers include, but are not limited to, sputter deposition, evaporation, chemical vapor deposition (CVD) and electroplating. Background on these techniques and others is provided in, for example, R. F. Bunshah, *Handbook of Deposition Technologies for Films and Coatings, Second Edition*, Noyes Publishing, 1994, which is incorporated herein by reference. However, MTJ stack deposition has some special requirements that are different from those normally associated with, for example, multilevel metallization in semiconductor devices. The most important requirements, among others, include precise thin-layer controllability down to 0.01 nm, excellent material uniformity across-wafer and smooth interface morphology. Moreover, the necessity of controlling the magnetic properties of the ferromagnetic materials also imposes special requirements on the deposition process. For example, most ferromagnetic materials have an inherent magnetic anisotropy that is related to ordering on an atomic scale. Such anisotropic behavior may affect the switching behavior of the material. Importantly, the direction of this anisotropy can be set during deposition of the layer by applying a uniform magnetic field across the wafer.

Because of these special requirements, the deposition of the ferromagnetic metals for the MTJ film stack will preferably be accomplished using sputter deposition techniques. In sputter deposition, ions are generated and directed at a target formed of the material intended to be deposited. The ions knock off target atoms which are transported to the substrate where they condense and form a film. Sputter deposition tends to produce extremely uniform metal films in both composition and thickness. Moreover, some commercially available sputter deposition equipment includes the ability to expose the substrate to a uniform magnetic field during deposition.

Figure 1B:
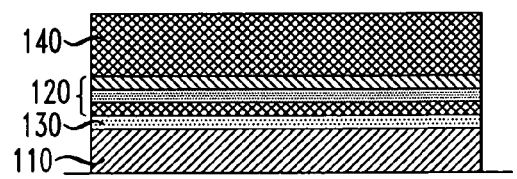

With reference to FIG. 1B, processing of the MTJ features is continued by the deposition of a masking layer 140 on an upper surface of upper magnetic layer 120. For compatibility with subsequent processing steps, the masking layer 140 is preferably formed of a refractory material such as, but not limited to, tantalum nitride and titanium nitride. However, one skilled in the art will recognize that any suitable material may be used and still fall within the scope of the invention. A masking layer comprising refractory materials will preferably be formed by sputter deposition.

Figure 1C:
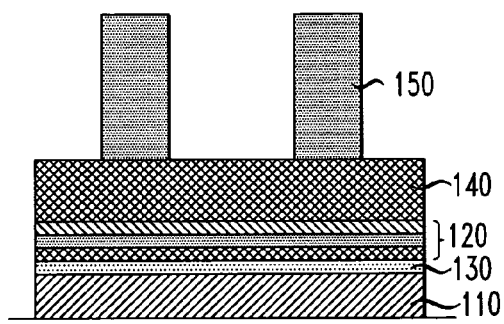
Figure 1D:
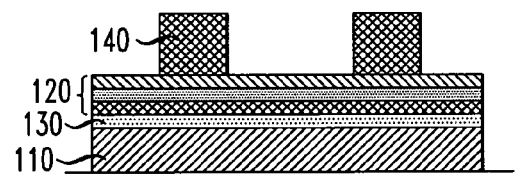

Next, photolithography is used to define those regions of the integrated circuit where MTJ features are intended. FIG. 1C shows a layer of photoresist 150 deposited on top of the masking layer 140 and patterned using commonly available photolithograpic techniques. Subsequently, with the developed photoresist 150 in place, the masking layer 140 is exposed to an anisotropic etching process, preferably RIE, so that trenches are formed in the masking layer 140. The patterned masking layer 140 is shown in FIG. 1D after the photoresist 150 is stripped.

In accordance with an aspect of the invention, the sidewalls of the trenches formed in the masking layer 140 are substantially vertical, meaning that they are substantially perpendicular to the upper surface of a substrate on which the MTJ stack is formed. Advantageously, the formation of trenches in refractory metal layers with vertical sidewalls is generally considered less demanding from a processing standpoint than forming trenches with taper angles that are reproducible across-wafer and from wafer-to-wafer. RIE reactants may include, but are not limited to, triflouromethane, tetraflouromethane and tetrachlorosilane.

Figure 1E:
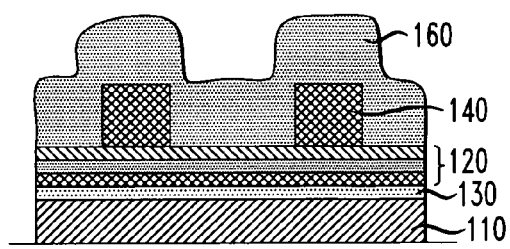
Figure 1F:
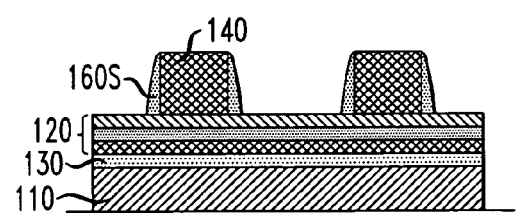

In accordance with another aspect of the invention, a spacer layer 160 is next conformally deposited on the exposed surfaces of the MTJ film stack, as shown in FIG. 1E. In this illustrative embodiment, the spacer layer 160 is preferably composed of silicon nitride or silicon dioxide. Nonetheless, other suitable materials may be used and still fall within the scope of the invention. Silicon nitride deposition for the spacer layer 160 is preferably performed by CVD with silane and ammonia as the reactants. Silicon dioxide deposition is preferably performed by CVD with silane and oxygen, or tetraethoxyorthosilicate (TEOS), as the reactants. Such CVD deposition techniques generally have excellent conformality and gap-filling characteristics.

After the spacer layer 160 is formed, it is anisotropically etched to form sidewall spacer features by an etching process which does not etch, or only slowly etches, the patterned masking layer 140 and the upper magnetic layer 120. Such an etching step is preferably performed by RIE. The directional nature of the RIE process leaves sidewall spacer features, represented collectively by sidewall spacer feature 160S, on the sidewalls of each of the vertical trenches in the patterned masking layer 140, but substantially removes any spacer layer material 160 from the horizontal surfaces of the film stack. In this step, the profile of the sidewalls of the trenches in the masking layer 140 is critical. If the sidewalls are not substantially vertical, the spacer layer 160 on the sidewalls of the trenches will have a higher etch rate during the sidewall spacer RIE step, and consequently will be thinned to a greater degree than would be the case if the sidewalls were substantially vertical.

Sidewall spacer features like those just described are used extensively in semiconductor processing in applications different from those described herein. For example, silicon nitride sidewall spacer features are frequently used in association with a gate stack in metal-oxide-semiconductor field effect transistors to both protect the sidewalls of the gate stack and to act as self-aligned masks during ion implantation. In accordance with an advantage of the invention, sidewall spacer features 160S formed using the foregoing processing steps are readily formed with a characteristic tapered profile. Furthermore, because these tapered features are formed using a combination of well-controlled and well-characterized processing steps (e.g., dielectric film deposition and dielectric RIE), the size and profile of the sidewall spacer features 160S tends to be extremely reproducible.

Figure 1G:
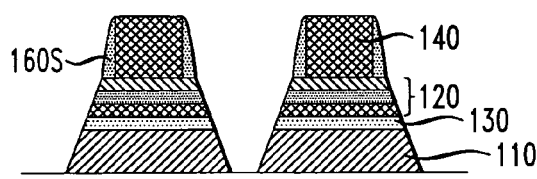

To complete the patterning of the MTJ features in accordance with the first illustrative embodiment, the MTJ film stack is etched anisotropically, preferably by RIE, with the patterned masking layer 140 and sidewall spacer features 160S in place. The results of this step are shown in FIG. 1G. The RIE process is performed in such a way that it selectively etches the magnetic layers 110, 120 and the dielectric layer 130 while not etching, or only slowly etching, the patterned masking layer 140 and the sidewall spacer features 160S. In this way, the patterned masking layer 140 and sidewall spacer features 160S act as what is commonly referred to as a hard mask. Such a RIE process can, for example, be accomplished by using reactants comprising chlorine.

In accordance with an advantage of the invention, the tapered profile of the sidewall spacer features 160S results in the underlying MTJ features also having a tapered profile. This phenomenon occurs, at least in part, because the sidewall spacer features 160S are progressively eroded during the RIE processing by sputtering. This effectively means that the holes in the masking layers through which RIE reactants are etching the MTJ features slowly expand as the etching process proceeds. A tapered MTJ feature profile is thereby achieved, along with its resultant reduction in etching byproduct redeposition. Higher processing yield is thus obtained by using methods in accordance with this invention.

Figure 2A:
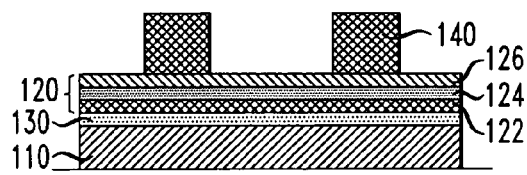
FIGS. 2A-2F show sectional views of MTJ features during various states of processing in accordance with a second illustrative embodiment of the invention.
Figure 2B:
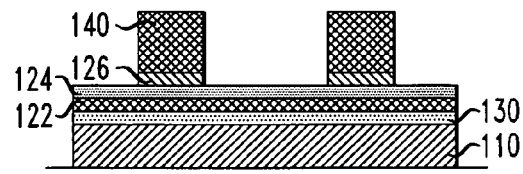
Figure 2C:
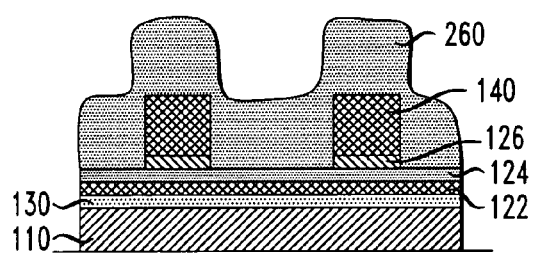

Alternatively, in accordance with a second illustrative process embodiment, sidewall spacer features may be used to allow a portion of the MTJ film stack to be processed while a different portion remains encapsulated and unmodified. Such an embodiment is illustrated in FIGS. 2A-2F, wherein like reference numerals denote identical or equivalent structural elements. FIG. 2A shows the MTJ film stack with a patterned masking layer 140 in place. The processing up to this point is preferably identical to that described above with respect to FIGS. 1A-1D. At this point in the process, however, the upper magnetic sublayer 126 in the upper magnetic layer 120 is etched, preferably by RIE, using the patterned masking layer 140 as a hard mask. In accordance with an aspect of the invention, the etching is accomplished such that the trench formed in the patterned masking layer 140 and the upper magnetic sublayer 126 is substantially vertical. This vertical profile will, as above, facilitate the formation of sidewall spacer features in later processing.

It is noted that the RIE process described in the previous step is illustrative and need not necessarily etch just the upper magnetic layer 126 as shown in the figure to fall within the scope of the invention. Alternatively, the etch may be designed to stop directly on the barrier layer 130 or on the lower magnetic layer 110, or the etch may stop partially through the barrier layer or lower magnetic layer. Moreover, the etch may be designed to stop on any given sublayer within the upper and lower magnetic layers 110, 120. Such variations will depend on the particular application, and will be apparent to one skilled in the art in light of the illustrative embodiments described herein.

Figure 2D:
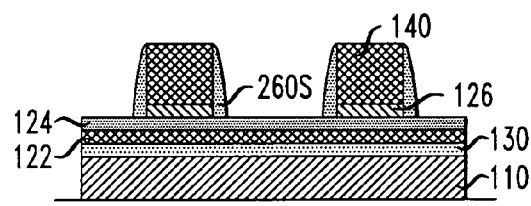
Figure 2E:
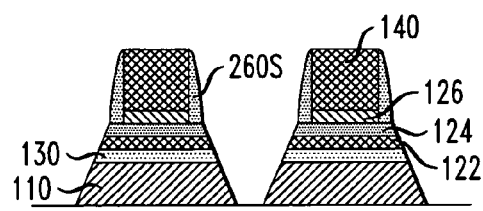

In subsequent processing, a spacer layer 260 is deposited on the exposed upper surfaces of the MTJ film stack, preferably by CVD, to fill the trenches formed in the masking layer 140 and the upper magnetic sublayer 126. The spacer layer 260 is then anisotropically etched, preferably by RIE, to form sidewall spacer features, collectively represented by sidewall spacer feature 260S, on the sidewalls of the trenches. This is shown in FIG. 2D. In the next processing step, the remainder of the exposed MTJ film stack is etched, preferably by RIE. In this case, the etch process will be masked by the patterned masking layer 140 and the sidewall spacer features 260S, as it was in the first embodiment described above. The result of such an etch step is shown in FIG. 2E.

Advantageously, at this point in the process, the upper portion of the film stack, here the upper magnetic sublayer 126, is entirely encapsulated by the sidewall spacer features 260S and the patterned masking layer 140. This allows the exposed portion of the film stack to be further processed while the encapsulated upper region remains intact and unmodified.

Moreover, it can be seen that the process steps illustrated in FIGS. 2A-2E are capable of forming a MTJ film stack wherein an upper portion of the film stack has a narrower width than the bottom portion of the film stack. In the particular illustrated embodiment shown in the figures, for example, the encapsulated upper magnetic sublayer 126 in the upper magnetic layer 120 has a width that is narrower than the remainder of the MTJ film stack. It will be recognized, however, that the particular layer or sublayer at which the width change occurs can easily be adjusted by stopping the RIE process illustrated in FIG. 2B at different places in the film stack. For example, rather than having this RIE step etch through the upper magnetic sublayer 126 and stop on the coupling layer 124 in the upper magnetic layer 120, this RIE step could be designed to etch through the entirety of the upper magnetic layer 120 and stop on the dielectric layer 130. After processing analogous to the steps shown in FIGS. 2C and 2D, the resultant MTJ would, in this case, have an upper magnetic layer 120 that, in its entirety, is narrower than the dielectric layer 130 and the lower magnetic layer 110.

Figure 2F:
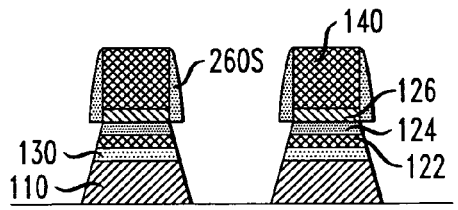

These width changes may be advantageous for a number of reasons, both from design and processing standpoints. From a design standpoint, magnetic layers and sublayers of differing widths may allow the designer to fine tune the magnetic interactions between the different magnetic layers, especially those interactions occurring at the edges of the device. From a processing standpoint, the additional width in the bottommost layers allows dimensional changes from various subsequent processing steps to be compensated for. For example, thermally oxidizing or wet chemical etching the lower exposed portion of the MTJ film stack will typically consume some of the width of those layers. Biasing the exposed portion to a larger width than the encapsulated portion using the sidewall spacer process described above allows this kind of process bias to be compensated for such that after the subsequent processing is performed, the encapsulated and exposed portions of the MTJ film stack have approximately the same width. The result of such subsequent processing is shown in FIG. 2F.

Figure 3:
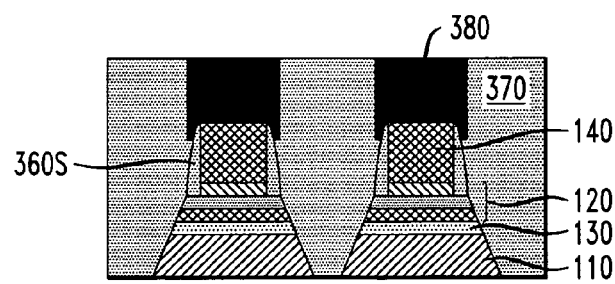
FIG. 3 shows a sectional view of a MTJ feature in accordance with a third illustrative embodiment of the invention.

Additionally, or alternatively, in a third illustrative embodiment, the sidewall spacer features may be left in place and used as a self-aligned vertical contact from a MTJ feature to higher metallization levels. Such an implementation is shown in FIG. 3. In this case, the sidewall spacer features, represented collectively by sidewall spacer feature 360S, are made of an electrically conductive material rather than a dielectric material. The conductive material could, for example, comprise tantalum nitride or titanium nitride. After following steps analogous to those shown in FIGS. 2A-2E, the patterned masking layer 140 and sidewall spacer features 360S are left in place rather than removed. In further processing steps, an interlevel dielectric 370 is deposited around the structure and a metal feature 380 is formed therein according to commonly used semiconductor fabrication techniques. The metal feature 380 is formed such that it is in electrical and physical contact with the conducting sidewall spacer features 360S.

Advantageously, these vertical contacts provide a reliable and relatively easy way to form an electrical contact between upper magnetic layer 120 and higher levels of metallization. Without the use of these features, a sufficient number of discrete contacts would have to be formed and landed on the upper magnetic layer 120. Forming of these discrete contacts would typically require the use of at least an additional photolithograpic mask and additional etching steps, thereby adding substantial cost and complexity to the manufacturing process. This cost and complexity is, in this way, avoided by the use of methods within the scope of this invention.

The processes described herein may be implemented to form an integrated circuit. In forming integrated circuits, a plurality of identical die is typically fabricated in a repeated pattern on a surface of an semiconductor wafer. Each die includes a device formed by the methods described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

Although illustrative embodiments of the present invention have been described herein with reference to the accompanying figures, it is to be understood that the invention is not limited to those precise embodiments, and that various other changes and modifications may be made therein by one skilled in the art without departing from the scope of the appended claims.

What is claimed is:

1. A method of forming a magnetic tunnel junction, the method comprising the steps of:

forming a film stack, the film stack comprising one or more magnetic layers and one or more masking layers, at least one of the one or more masking layers comprising a refractory material;

forming one or more trenches in the film stack, sidewalls of the one or more trenches being substantially vertical;

forming a spacer layer at least partially on top of the film stack, the spacer layer comprising an electrically conductive material;

etching the spacer layer using substantially anisotropic etching such that portions of the spacer layer only remain on the sidewalls of the one or more trenches in the film stack, the etched spacer layer being substantially tapered;

etching at least a portion of the film stack utilizing the etched spacer layer as a mask using substantially anisotropic etching, portions of the one or more masking layers acting as a mask during the step of etching at least a portion of the film stack, the etched portion of the film stack being substantially tapered; and forming a metallization feature above at least a portion of the film stack, wherein the etched spacer layer is operative to electrically connect the film stack to the metallization feature.

* * * * *